(12) United States Patent
Nagahama et al.

(10) Patent No.: US 7,781,259 B2
(45) Date of Patent: Aug. 24, 2010

(54) METHOD OF MANUFACTURING A SEMICONDUCTOR USING A RIGID SUBSTRATE

(75) Inventors: Youhei Nagahama, Aizuwakamatsu (JP); Katsunori Wako, Aizuwakamatsu (JP); Yuichi Asano, Aizuwakamatsu (JP); Masanori Takahashi, Aizuwakamatsu (JP); Haruo Kojima, Aizuwakamatsu (JP); Masamichi Fujimoto, Aizuwakamatsu (JP); Hiroshi Ohtsubo, Aizuwakamatsu (JP); Yuki Yasuda, Aizuwakamatsu (JP)

(73) Assignee: Fujitsu Semiconductor Limited, Yokohama (JP)

( * ) Notice: Subject to any disclaimer, the term of this patent is extended or adjusted under 35 U.S.C. 154(b) by 658 days.

(21) Appl. No.: 11/516,584

(22) Filed: Sep. 7, 2006

(65) Prior Publication Data
US 2007/0010046 A1    Jan. 11, 2007

Related U.S. Application Data

(62) Division of application No. 10/781,794, filed on Feb. 20, 2004, now Pat. No. 7,122,402.

(30) Foreign Application Priority Data
Sep. 29, 2003    (JP)    ............... 2003-338147

(51) Int. Cl.
H01L 21/44  (2006.01)
H01L 21/48  (2006.01)
H01L 21/50  (2006.01)

(52) U.S. Cl. ............... 438/108; 438/26; 438/51; 438/55; 438/112; 438/127

(58) Field of Classification Search ............... 438/26, 438/51, 55, 108, 112, 126, 127, FOR. 367, 438/FOR. 371, FOR. 379, FOR. 384
See application file for complete search history.

(56) References Cited

U.S. PATENT DOCUMENTS 4,913,638 A * 4/1990 Buja ............... 425/140

(Continued)

FOREIGN PATENT DOCUMENTS

JP    9-116050 A    5/1997

(Continued)

OTHER PUBLICATIONS

Translation of JP-9-116050, cited on IDS filed Sep. 7, 2006, pp. 1-4.*

(Continued)

*Primary Examiner*—Matthew Smith
*Assistant Examiner*—Joannie A Garcia
(74) *Attorney, Agent, or Firm*—Westerman, Hattori, Daniels & Adrian, LLP

(57) ABSTRACT

In a method of manufacturing a semiconductor device of the invention, a rigid substrate which supports one or more semiconductor elements on a surface of the substrate and is clamped between an upper mold and a lower mold of an encapsulation mold at a time of resin encapsulation is provided, so that a vent-end edge portion of the substrate corresponding to a vent end of the encapsulation mold has a thickness smaller than a thickness of other portions of the substrate. The substrate is disposed in the encapsulation mold, and resin is injected into a cavity between the upper mold and the substrate to encapsulate the semiconductor elements with the resin.

5 Claims, 10 Drawing Sheets

U.S. PATENT DOCUMENTS

| | | | |
|---|---|---|---|
| 5,962,962 A * | 10/1999 | Fujita et al. | 313/412 |
| 6,081,997 A | 7/2000 | Chia et al. | |
| 6,767,767 B2 | 7/2004 | Hayashida et al. | |
| 2003/0201592 A1 * | 10/2003 | Cummines et al. | 269/224 |

FOREIGN PATENT DOCUMENTS

| | | |
|---|---|---|
| JP | 2000-58716 A | 2/2000 |
| JP | 2002-110718 A | 4/2002 |
| JP | 2003-17625 A | 1/2003 |
| JP | 2003-77946 A | 3/2003 |

OTHER PUBLICATIONS

Translation of JP-9-116050 cited on IDS filed Sep. 7, 2006, Detailed Description including pp. 1-4, and Drawings including pp. 1-2.*
Office Action dated Mar. 18, 2008 issued in corresponding Japanese Application No. 2003-338147.

* cited by examiner

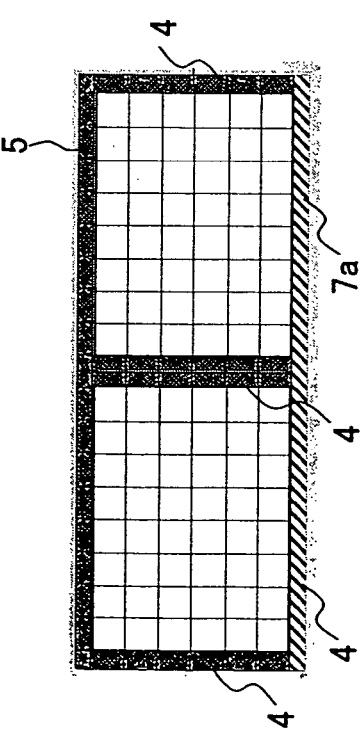
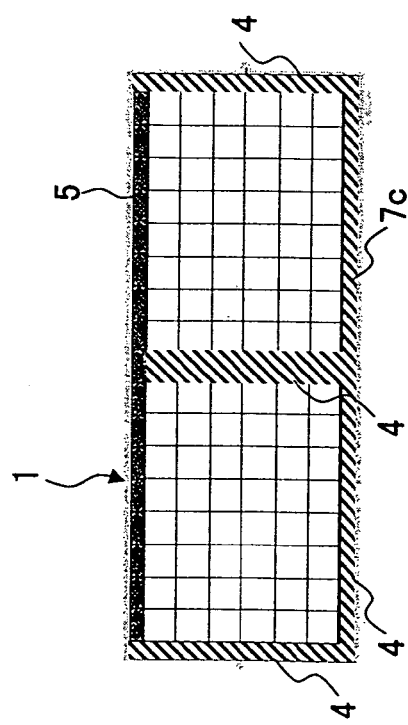
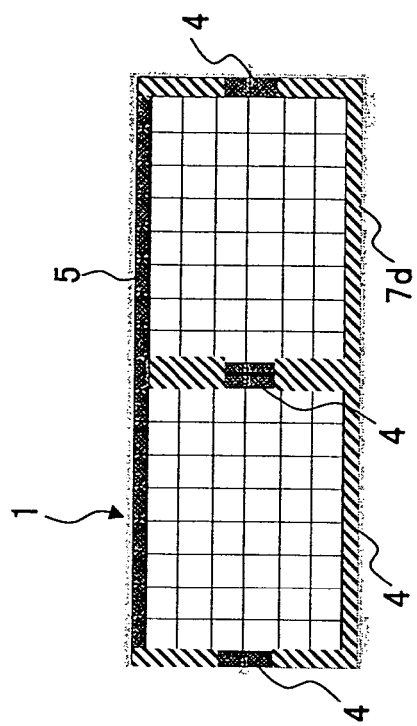
FIG.3A  FIG.3B  FIG.3C  FIG.3D

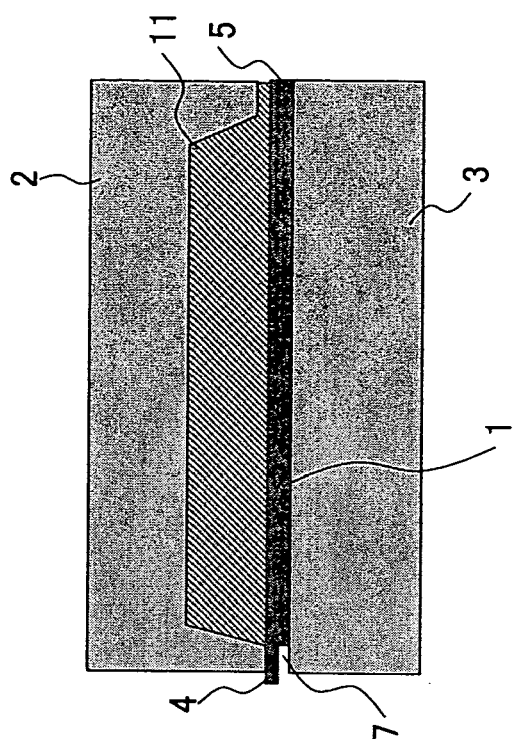
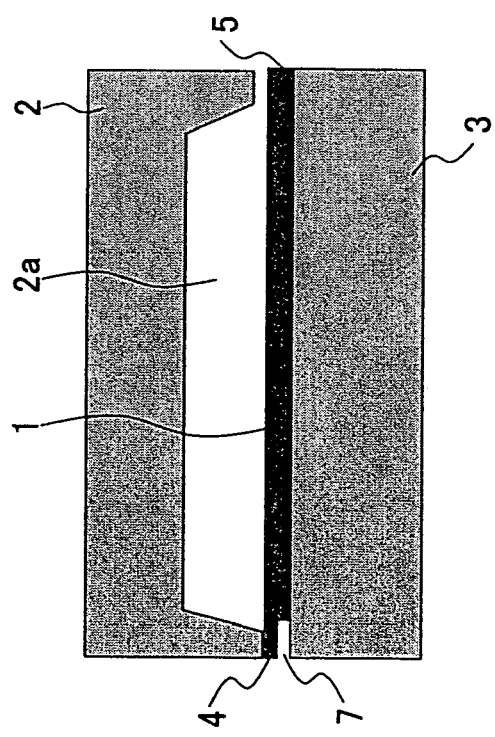
FIG.4A
FIG.4B

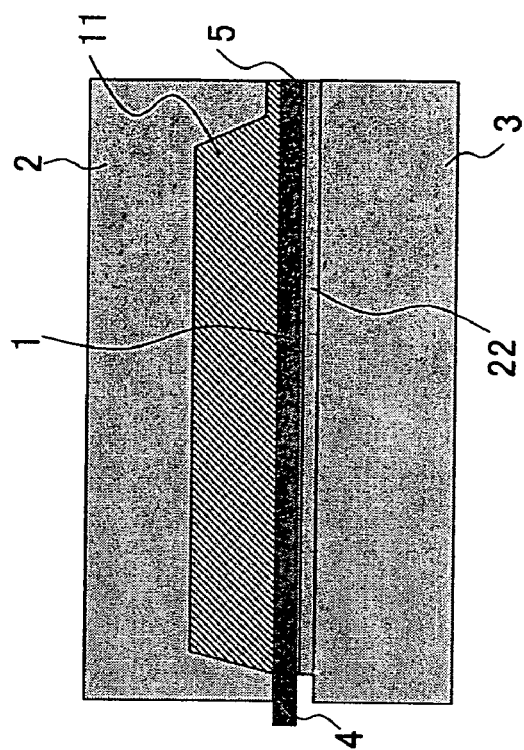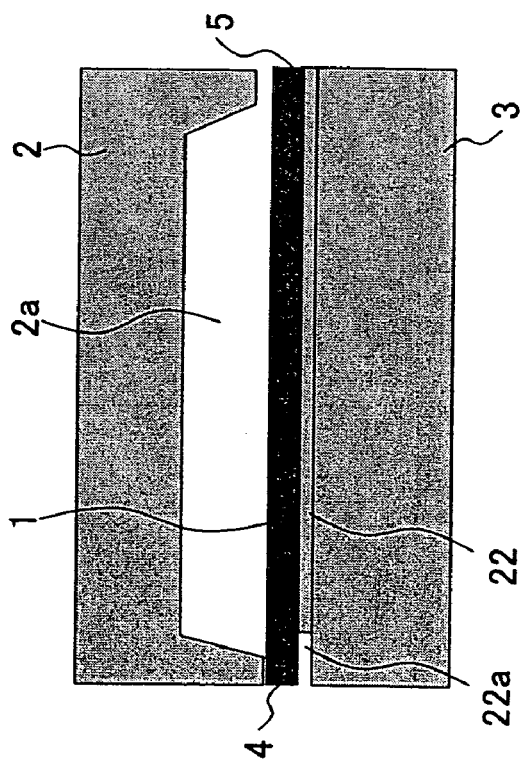

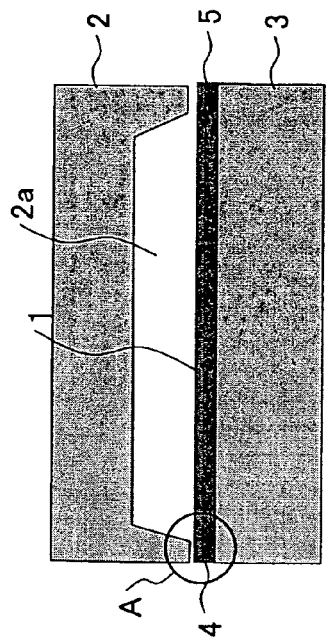
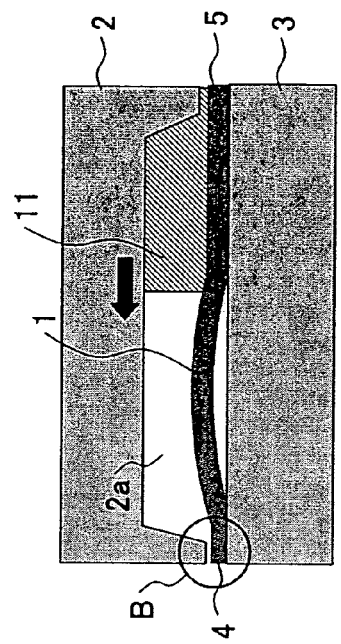
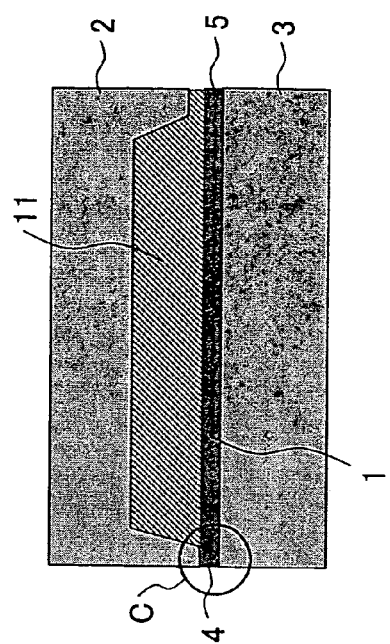
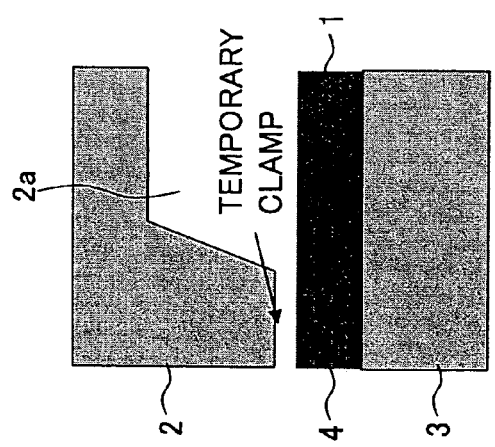
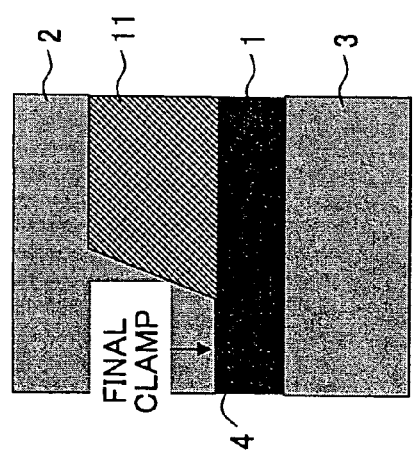
FIG.10A
FIG.10B
FIG.10C
FIG.10D
FIG.10E

METHOD OF MANUFACTURING A SEMICONDUCTOR USING A RIGID SUBSTRATE

CROSS-REFERENCE TO RELATED APPLICATIONS

This application is a divisional of U.S. application Ser. No. 10/781,794 filed on Feb. 20, 2004. This application is based upon and claims the benefit of priority from the prior Japanese patent application No. 2003-338147, filed on Sep. 29, 2003, the entire contents of which are incorporated herein by reference.

BACKGROUND OF THE INVENTION

1. Field of the Invention

The present invention relates to a manufacturing method of a semiconductor device of resin-encapsulation type using a rigid substrate.

2. Description of the Related Art

In a semiconductor device (semiconductor package) of surface mounting type, the semiconductor elements (chips) with the semiconductor integrated circuit formed therein are mounted on the semiconductor device surface. In such a semiconductor device, the bump electrodes are provided as the external terminals and the chip carrier substrate is provided to support the semiconductor elements thereon. For example, CSP (chip scale package), BGA (ball grid array), etc. are known as examples of this semiconductor device.

In recent years, with the demands of the small size, slim and lightweight structure of electronic devices, the surface mounting type semiconductor packages have come to be briskly adopted. Among the semiconductor packages of this type, the CSP is the general term of the semiconductor package having the small-size and slim structure, the size being equivalent to or slightly larger than the chip size.

For example, the CSP has been developed which is configured to have the structure that the semiconductor chips are carried on the surface of the chip carrier substrate, and a resin encapsulation portion is formed by carrying out the resin encapsulation to encompass the surface of the chip carrier substrate where the semiconductor chips are supported.

There are two kinds of the resin-encapsulation type semiconductor packages mentioned above: one using the tape substrate as the chip carrier substrate, and the other using the rigid substrate as the chip carrier substrate.

It is known that an example of the semiconductor packages of the kind using the tape substrate is the CSP in which a polyimide tape having certain flexibility is used as the tape substrate. On the other hand, it is known that an example of the semiconductor packages of the kind using the rigid substrate is the CSP in which a ceramic or resin substrate having certain rigidity is used as the rigid substrate.

The unified molding method has been developed as the technology of improving the efficiency of production of chip scale packages (CSP) which are manufactured using the rigid substrate or the tape substrate with low cost. In the unified molding method, two or more semiconductor elements (chips) are arranged in an array formation and mounted on the chip carrier substrate (for example, the rigid substrate), and the chip array region, including the semiconductor elements, is subjected to the resin encapsulation and molding in a unified manner so that the resin-encapsulation portion is formed. After the resin encapsulation is performed, the dicing is performed so that the chip array region with the resin-encapsulation portion formed is divided into the respective separate chips by cutting.

In recent years, there is the trend that the semiconductor packages using the rigid substrate are directed to having the inexpensive and slim structure, and such semiconductor packages are in the tendency that the rigid substrate is enlarged (or the whole substrate surface to be used to support the semiconductor element) and the rigid substrate has the slim structure.

Japanese Laid-Open Patent Application No. 2002-110718 discloses a manufacturing method of a semiconductor device. In this method, a plurality of semiconductor chips are supported on the tape substrate, and the unified resin encapsulation of the same is performed. It is disclosed that, in order to reduce the curvature of the resin encapsulation portion, the unified resin encapsulation is performed using the encapsulation mold which is provided with the convex portion on the cavity formation surface of the mold.

With the enlarged and slim structure of the rigid substrate, some small curvature and bending defects may arise in the chip carrier substrate of the semiconductor package due to the processing heat applied in the die-bonding process or the wire-bonding process.

Subsequently, the transfer molding process is performed. In the transfer molding process, the curvature or bending defects arising in the preceding process are pushed toward the vent-end of the mold (or in the direction where the resin flows) by the resin injection pressure, and the curvature or bending defects are concentrated on the vent-end of the mold. Hence, there is the problem that the rigid substrate will curve greatly.

Moreover, there is the problem that the semiconductor chips mounted on the rigid substrate are subjected to the residual stress due to the curvature or bending defects after the resin encapsulation is performed so that the semiconductor chips will be damaged, or the bonding wires will be deformed.

FIG. 1A and FIG. 1B are diagrams for explaining a conventional molding process of a semiconductor device using a rigid substrate.

FIG. 1A shows a state of the semiconductor device at the time of resin injection in the unified molding process of the semiconductor device, and FIG. 1B shows a state of the semiconductor device after the resin injection is performed.

The rigid substrate 1 of FIG. 1A is the circuit board which contains a printed circuit board made of glass epoxy resin or a ceramic substrate. It should be noted that the rigid substrate 1 has some rigidity unlike the tape substrate.

The electrodes and wiring pattern for interconnection with the electrodes of the semiconductor device are formed on the front surface of the rigid substrate 1, and the electrodes for interconnection with the external electrodes are formed on the back surface of the rigid substrate 1.

The encapsulation mold used by the molding process of FIG. 1A is provided with the upper mold 2 and the lower mold 3, and the mold cavity is formed on the back surface of the upper mold 2.

In the manufacturing method of the semiconductor device which is in the state before the resin injection as shown in FIG. 1A, the rigid substrate 1 is disposed between the upper mold 2 and the lower mold 3.

The die-bonding and wire-bonding processes are already performed with the rigid substrate 1 in the state of FIG. 1A, a plurality of semiconductor elements (chips) (not shown) are arranged in an array formation on the chip-support surface of the rigid substrate 1. The chips are mounted in the chip array region of the rigid substrate 1, and the electrodes (pads) of the semiconductor elements and the connection terminals (electrodes) of the rigid substrate 1 are connected each other by the bonding wires.

With the processing heat applied in the die-bonding process or the wire-bonding process, the curvature of the rigid substrate 1 may often arise.

As shown in FIG. 1A, the resin 11 is injected into the mold cavity of the upper mold 2 from the gate-end of the mold on the right-hand side of the Figure.

As shown in FIG. 1B, the resin-encapsulation portion is formed by carrying out the resin encapsulation of the semiconductor elements (chips) carried on the chip support surface of the rigid substrate 1 collectively with the injected resin 11.

However, as described above, in the transfer molding process of FIG. 1A, the curvature or bending defects arising in the preceding process are pushed toward the vent-end of the mold (in the direction where the resin 11 flows) by the resin injection pressure, and the curvature or bending defects are concentrated on the vent-end of the mold. Therefore, there is the problem that the rigid substrate 1 will curve greatly.

In FIG. 1B, reference numeral 9 indicates the position of the rigid substrate 1 where a relatively large curvature of the rigid substrate 1 arises and the deformation of the wires connected to the semiconductor elements occurs.

On the other hand, in the semiconductor packages using the tape substrate, the tape substrate itself has some flexibility, and the problem of the wire deformation as shown in FIG. 1B does not arise. However, there is the problem that the tape substrate is expensive when compared with the rigid substrate, and it is not adequate to satisfy the recent requirements of the substrate enlargement and the cost reduction.

SUMMARY OF THE INVENTION

An object of the present invention is to provide an improved method of manufacturing a semiconductor device in which the above-described problems are eliminated.

Another object of the present invention is to provide a method of manufacturing a semiconductor device of resin-encapsulation type using a rigid substrate in which the deformation of the rigid substrate after the resin encapsulation and the deformation of the semiconductor elements or the wires at the time of the resin encapsulation are reduced effectively by improvement of the rigid substrate or the encapsulation mold.

The above-mentioned objects of the present invention are achieved by a method of manufacturing a semiconductor device, comprising the steps of: providing a rigid substrate which supports one or more semiconductor elements on a surface of the substrate and is clamped between an upper mold and a lower mold of an encapsulation mold at a time of resin encapsulation, so that a vent-end edge portion of the substrate corresponding to a vent end of the encapsulation mold has a thickness smaller than a thickness of other portions of the substrate; disposing the substrate in the encapsulation mold; and injecting resin into a cavity between the upper mold and the substrate to encapsulate the semiconductor elements with the resin.

The above-mentioned objects of the present invention are achieved by a method of manufacturing a semiconductor device, comprising the steps of: providing an encapsulation mold having an upper mold and a lower mold for clamping a rigid substrate, which supports one or more semiconductor elements on a surface of the substrate, between the upper mold and the lower mold at a time of resin encapsulation, so that the low mold has a void at a vent end of the encapsulation mold which confronts a vent-end edge portion of the substrate; disposing the substrate in the encapsulation mold; and injecting resin into a cavity between the upper mold and the substrate to encapsulate the semiconductor elements with the resin.

The above-mentioned objects of the present invention are achieved by a method of manufacturing a semiconductor device, comprising the steps of: providing a rigid substrate which supports one or more semiconductor elements on a front surface of the substrate and is clamped between an upper mold and a lower mold of an encapsulation mold at a time of resin encapsulation; attaching a cover film to a back surface of the substrate so that the back surface of the substrate except a vent-end edge portion of the substrate corresponding to a vent end of the encapsulation mold is covered by the cover film so as to form a void at the vent-end edge portion; disposing the substrate with the cover film in the encapsulation mold; and injecting resin into a cavity between the upper mold and the substrate to encapsulate the semiconductor elements with the resin.

The above-mentioned objects of the present invention are achieved by a method of manufacturing a semiconductor device, comprising the steps of: providing an encapsulation mold having an upper mold and a lower mold for clamping a rigid substrate, which supports one or more semiconductor elements on a surface of the substrate, between the upper mold and the lower mold at a time of resin encapsulation; attaching a release film to a surface of the lower mold so that the surface of the lower mold except a portion confronting a vent-end edge portion of the substrate corresponding to a vent end of the encapsulation mold is covered by the release film so as to form a void at the vent-end edge portion; disposing the substrate in the encapsulation mold; and injecting resin into a cavity between the upper mold and the substrate to encapsulate the semiconductor elements with the resin.

The above-mentioned objects of the present invention are achieved by a method of manufacturing a semiconductor device, comprising the steps of: providing a rigid substrate which supports one or more semiconductor elements on a surface of the substrate and is clamped between an upper mold and a lower mold of an encapsulation mold at a time of resin encapsulation; forming the substrate with a slit located near a vent-end edge portion of the substrate corresponding to a vent end of the encapsulation mold; attaching a release film to a surface of the lower mold so that the entire surface of the lower mold is covered by the release film; disposing the substrate with the slit formed therein in the encapsulation mold; and injecting resin into a cavity between the upper mold and the substrate to encapsulate the semiconductor elements with the resin.

The above-mentioned objects of the present invention are achieved by a method of manufacturing a semiconductor device, comprising the steps of: disposing a rigid substrate, which supports one or more semiconductor elements on a surface of the substrate, between an upper mold and a lower mold of an encapsulation mold; clamping the substrate with the upper mold and the lower mold by setting a clamping pressure to a first pressure that is small enough to allow separation of the upper mold from the substrate surface at a vent-end edge portion of the substrate; injecting resin into a cavity of the encapsulation mold; setting, after an end of the resin injection, the clamping pressure to a second pressure that is larger than the first pressure and enough to compress the substrate surface by the upper mold at the vent-end edge portion; and encapsulating the semiconductor elements supported on the substrate surface with the injected resin.

According to the manufacturing method of the present invention, the deformation, such as curvature or bending of the rigid substrate, arising in the unified molding process can be reduced. Moreover, the deformation of the wires of the semiconductor elements can be prevented by reducing the curvature or bending of the rigid substrate. Furthermore, the residual stress due to the curvature or bending of the semiconductor package after the resin encapsulation is performed can be reduced in order to prevent damaging of the internal semiconductor elements.

BRIEF DESCRIPTION OF THE DRAWINGS

Other objects, features and advantages of the present invention will be apparent from the following detailed description when read in conjunction with the accompanying drawings.

FIG. 3A, FIG. 3B, FIG. 3C and FIG. 3D are diagrams showing variations of the rigid substrate according to the invention.

FIG. 4A and FIG. 4B are diagrams for explaining a molding process of the semiconductor device using the rigid substrate of FIG. 3A in an embodiment of the manufacturing method of the invention.

FIG. 6A and FIG. 6B are diagrams for explaining a molding process in another embodiment of the manufacturing method of the semiconductor device of the invention.

FIG. 10A, FIG. 10B, FIG. 10C, FIG. 10D and FIG. 10E are diagrams for explaining a molding process in another embodiment of the manufacturing method of the semiconductor device of the invention.

DETAILED DESCRIPTION OF PREFERRED EMBODIMENTS

A description will now be given of preferred embodiments of the present invention with reference to the accompanying drawings.

Figure 1A:
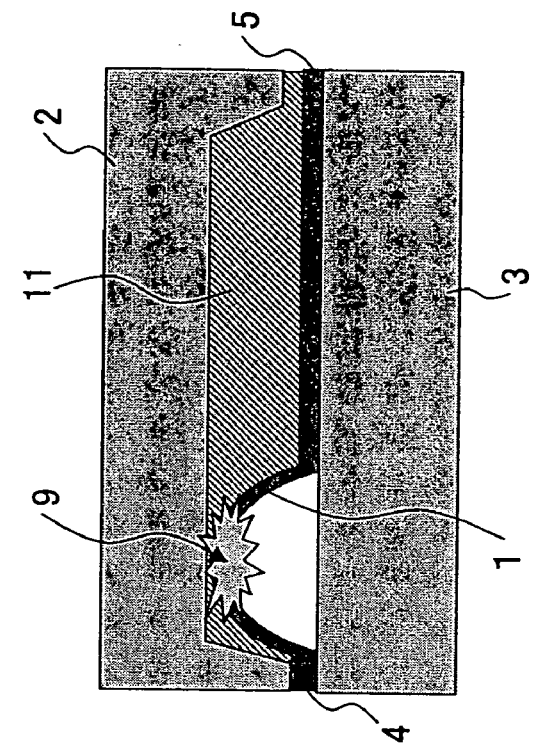
FIG. 1A and FIG. 1B are diagrams for explaining a conventional molding process of a semiconductor device using a rigid substrate.
Figure 1B:
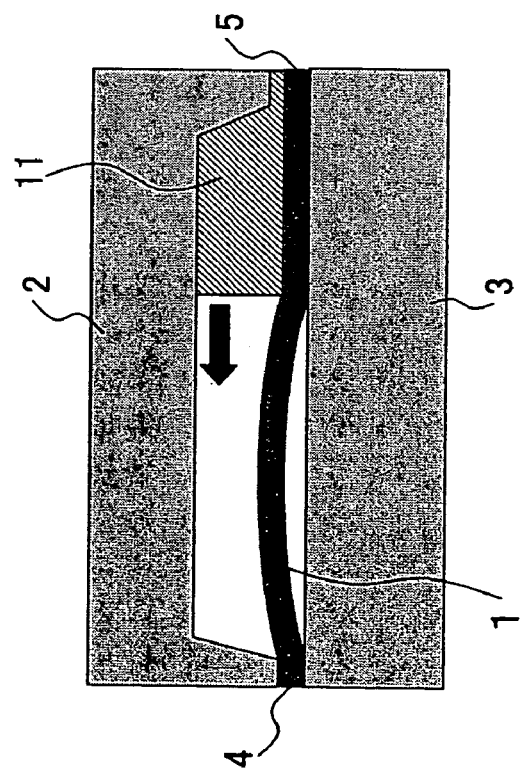
Figure 2:
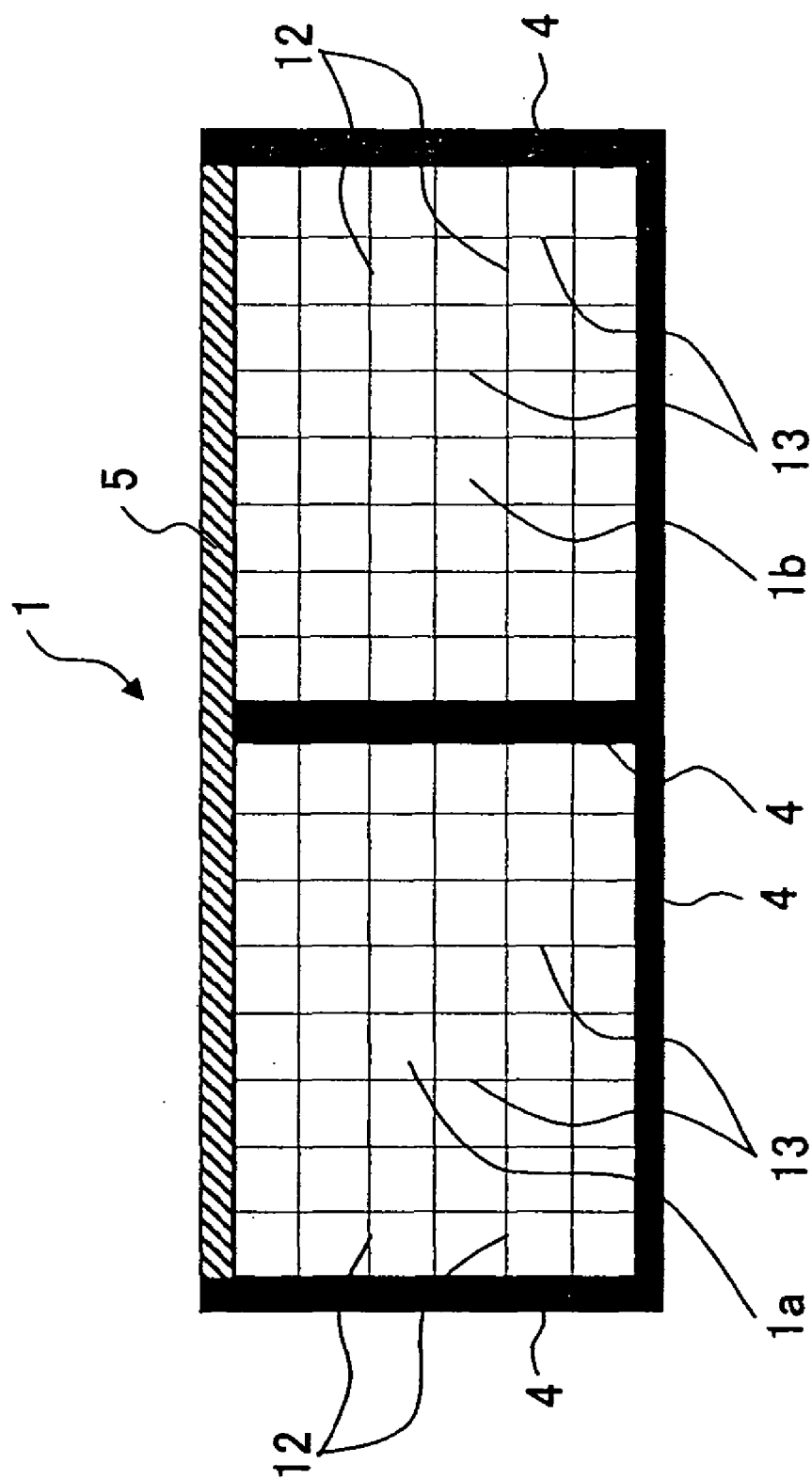
FIG. 2 is a diagram showing an embodiment of the rigid substrate according to the invention.

FIG. 2 shows an embodiment of the rigid substrate according to the invention.

As shown in FIG. 2, the rigid substrate 1 is in a generally rectangular form. The rigid substrate 1 includes a gate-end edge portion 5 (indicated by the shaded lines in FIG. 2), a set of vent-end edge portions 4 (indicated in black in FIG. 2), a chip support surface which supports a plurality of semiconductor elements (chips) thereon, and an electrode support surface which is opposite to the chip support surface.

The die-bonding process and the wire-bonding process are already performed with the rigid substrate 1 of FIG. 2. The plurality of semiconductor elements (chips) are arranged on the chip support surface of the rigid substrate 1, and they are mounted in the chip array regions 1a and 1b. The surface electrodes (pads) of each semiconductor element and the connection terminals (electrodes) formed on the rigid substrate 1 are interconnected by the wires (not shown).

The chip support surface of the rigid substrate 1 is divided along its center into the chip array region 1a (the left half) and the chip array region 1b (the right half). In this embodiment, the 6×8 semiconductor elements (chips) in which the integrated circuits are formed therein are arranged in a two-dimensional array, and they are mounted in each of the chip array regions 1a and 1b, respectively.

The rigid substrate 1 of FIG. 2 is subjected to the unified molding process so that the resin-encapsulation portion is formed, and the semiconductor elements in the chip array regions 1a and 1b are encapsulated by the resin collectively.

The dicing process is performed after the resin encapsulation is performed. In the dicing process, the chip array regions 1a and 1b of the rigid substrate 1 enclosed in the resin-encapsulation portion are cut along the dicing lines 12 and 13, so that the semiconductor device is divided into the separate semiconductor elements (chips) by the cutting.

Moreover, before the unified molding process is performed, the rigid substrate 1 of FIG. 2 is disposed between the upper mold and the lower mold of the encapsulation mold, and the rigid substrate 1 is clamped by the encapsulation mold at the gate-end edge portion 5 and the vent-end edge portions 4 of the chip support surface.

In that case, the rigid substrate 1 is clamped not only at the vent-end edge portion 4 and the gate-end edge portion 5, which are the lower and upper edges of the rectangular-shape rigid substrate 1, but also at the vent-end edge portions 4, which are the left-hand, middle and right-hand edges of the rectangular-shape rigid substrate 1. Hence, the deformation of the rigid substrate after the resin encapsulation and the deformation of the semiconductor elements or the wires at the time of the resin encapsulation can be reduced effectively.

FIG. 3A through FIG. 3D show variations of the rigid substrate 1 according to the invention.

In the examples of FIG. 3A through FIG. 3D, the rigid substrate 1 is provided with the gate-end edge portion 5, the vent-end edge portions 4, the chip support surface which supports one or more semiconductor elements (chips) thereon, and the electrode support surface (the back surface) which is opposite to the chip support surface. The rigid substrate 1 is further provided with the solder-resist removal portion 7a to 7d (void) which is formed on the electrode support surface at the position corresponding to the vent-end edge portion 4 so that the thickness of the rigid substrate 1 at the vent-end edge portion 4 is smaller than the thickness of the remainder of the rigid substrate 1 other than the vent-end edge portion 4.

In the preparation of the rigid substrate 1, the solder-resist removal portion 7a to 7d is formed by removing entirely or partially the solder resist on the electrode support surface at the vent-end edge portion 4 of the rigid substrate 1.

In the rigid substrate 1 of this embodiment, the solder-resist removal portion 7a to 7d serves to reduce the deformation of the rigid substrate 1 after the resin encapsulation and the deformation of the semiconductor elements at the time of the resin encapsulation.

In the example of FIG. 3A, the solder-resist removal portion 7a (indicated by the shaded lines in FIG. 3A) is formed by removing entirely the solder resist on the electrode support surface at the vent-end edge portion 4 of the rigid substrate 1. This vent-end edge portion 4 corresponds to the lower edge of the rectangular-shape rigid substrate 1 as shown in FIG. 3A.

In the example of FIG. 3B, the solder-resist removal portions 7b (indicated by the shaded lines in FIG. 3B) are formed by removing partially and intermittently the solder resist on the electrode support surface at the vent-end edge portion 4 of the rigid substrate 1. This vent-end edge portion 4 corresponds to the lower edge of the rectangular-shape rigid substrate 1 as shown in FIG. 3B.

In the example of FIG. 3C, the solder-resist removal portions 7c (indicated by the shaded lines in FIG. 3C) are formed by removing entirely the solder resist on the electrode support surface at the vent-end edge portions 4 of the rigid substrate 1 other than the gate-end edge portion 5. The vent-end edge portions 4 correspond to the lower, left-hand, middle and right-hand edges of the rectangular-shape rigid substrate 1 as shown in FIG. 3C. Namely, the solder-resist removal portions 7c are formed by removing the solder resist on the electrode support surface of the rigid substrate 1 at all the edge portions of the rigid substrate 1 except the gate-end edge portion 5 which is the upper edge of the rectangular-shape rigid substrate 1.

In the example of FIG. 3D, the solder-resist removal portions 7d (indicated by the shaded lines in FIG. 3D) are formed by removing entirely or partially the solder resist on the electrode support surface of the rigid substrate 1 at all the edge portions of the rigid substrate 1 except the gate-end edge portion 5 which is the upper edge of the rectangular-shape rigid substrate 1. Namely, the solder-resist removal portions 7d are formed by removing entirely the solder-resist on the electrode support surface of the rigid substrate 1 at the vent-end edge portion 4 which is the lower edge of the rectangular-shape rigid substrate 1, and removing partially the solder-resist on the electrode support surface of the rigid substrate 1 at the vent-end edge portions 4 which are the left-hand, middle and right-hand edges of the rectangular-shape rigid substrate 1.

In the respective examples of the rigid substrate 1 shown in FIG. 3A through FIG. 3D, the deformation of the semiconductor elements in the molding process can be prevented by changing the solder-resist design on the back surface of the rigid substrate 1 at the portions other than the gate-end edge portion 5. Moreover, the residual stress in the rigid substrate 1 due to the curvature or bending of the rigid substrate 1 after the resin encapsulation is performed can be reduced.

In the following description, the solder-resist removal portion 7a to 7d mentioned above will be referred to as void 7.

FIG. 4A and FIG. 4B are diagrams for explaining the molding process of the semiconductor device using the rigid substrate of FIG. 3A in an embodiment of the manufacturing method of the invention.

As shown in FIG. 4A, the rigid substrate 1 of this embodiment is disposed between the upper mold 2 and the lower mold 3 of the encapsulation mold, and the void corresponding to the void 7 of the rigid substrate 1 is formed between the electrode support surface of the rigid substrate 1 and the lower mold 3 at the vent-end edge portion 4 of the rigid substrate 1.

Next, as shown in FIG. 4B, the resin is injected into the mold cavity 2a of the upper mold 2 of the encapsulation mold from the gate end (on the right-hand side of the Figure). The resin-encapsulation portion 11 (indicated by the shaded lines in FIG. 4B) which encapsulates the semiconductor elements supported by the chip support surface of the rigid substrate 1 is formed with the injected resin.

In the preparation process of the rigid substrate 1, the solder resist on the back surface of the rigid substrate 1 at the vent-end edge portion 4 of the rigid substrate 1 is removed or thinned. And, in the molding process of FIG. 4B, the void (or the solder-resist removal portion 7) is formed between the vent-end edge portion 4 of the rigid substrate 1 and the lower mold 3 by making the substrate thickness at the vent-end edge portion 4 smaller than at the remaining portions of the rigid substrate 1.

Accordingly, the clamping pressure exerted by the upper mold 2 and the lower mold 3 on the vent-end edge portion 4 of the rigid substrate 1 is reduced, and the stress, causing the curvature or bending of the rigid substrate 1 and acting in the direction toward the upper mold at the time of the resin injection, can be released to the vent end of the encapsulation mold, and the deformation of the wires as in the conventional manufacturing method can be prevented.

Moreover, the residual stress due to the curvature or bending of the semiconductor package after the resin encapsulation is performed can also be reduced, and the deformation and damage of the internal semiconductor elements (chips) can be prevented.

Figure 5A:
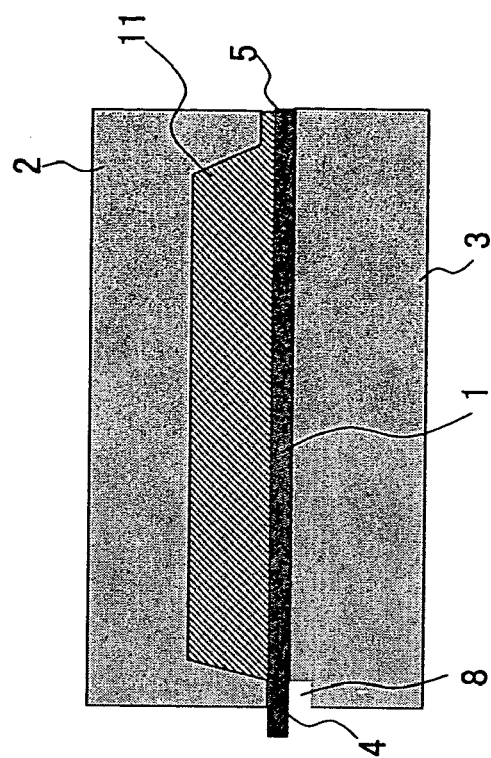
FIG. 5A and FIG. 5B are diagrams for explaining a molding process in another embodiment of the manufacturing method of the semiconductor device of the invention.
Figure 5B:
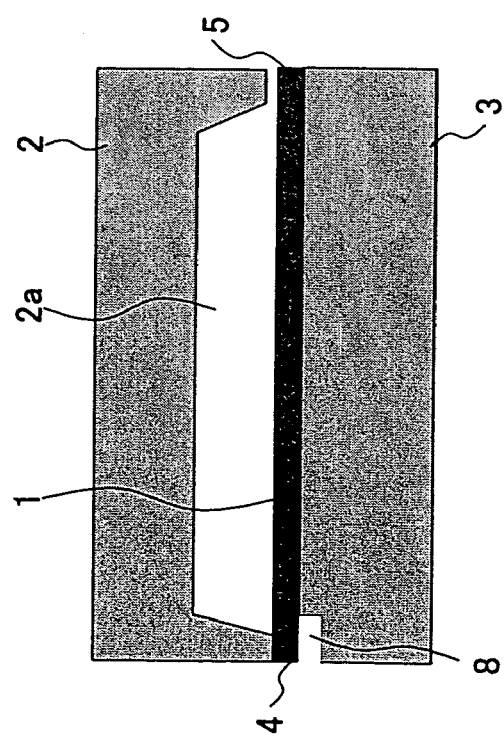

FIG. 5A and FIG. 5B are diagrams for explaining the molding process of the semiconductor device in another embodiment of the manufacturing method of the invention.

In the present embodiment, as shown in FIG. 5A, the encapsulation mold in which the void 8 is formed at a predetermined position on the side of the vent end of the lower mold 3 is prepared. The solder-resist removal portion 7 as in the previous embodiment is not prepared in the rigid substrate 1 of the present embodiment.

As shown in FIG. 5A, the rigid substrate 1 is disposed between the upper mold 2 and the lower mold 3 of the encapsulation mold, and the void corresponding to the void 8 of the lower mold 3 is formed between the electrode support surface (the back surface) of the rigid substrate 1 and the lower mold 3 at the vent-end edge portion 4 of the rigid substrate 1.

Next, as shown in FIG. 5B, the resin is injected into the mold cavity 2a of the upper mold 2 of the encapsulation mold from the gate end (on the right-hand side of the Figure). The resin-encapsulation portion 11 (indicated by the shaded lines in FIG. 5B) which encapsulates the semiconductor elements supported by the chip support surface of the rigid substrate 1 is formed with the injected resin.

According to the present embodiment, the vent-end portion of the lower mold 3 is cut off, and in the molding process of FIG. 5B, the void between the lower mold 3 and the vent-end edge portion 4 of the rigid substrate 1 is formed. Accordingly, the clamping pressure exerted by the upper mold 2 and the lower mold 3 on the vent-end edge portion 4 of the rigid substrate 1 is reduced, and the stress, causing the curvature or bending of the rigid substrate 1 and acting in the direction toward the upper mold at the time of the resin injection, can be released to the vent end of the encapsulation mold, and the deformation of the wires as in the conventional manufacturing method can be prevented.

Moreover, the residual stress due to the curvature or bending of the semiconductor package after the resin encapsulation is performed can also be reduced, and the deformation and damage of the internal semiconductor elements (chips) can be prevented.

FIG. 6A and FIG. 6B are diagrams for explaining the molding process of the semiconductor device in another embodiment of the manufacturing method of the invention.

In the present embodiment, as shown in FIG. 6A, a cover film 22 is attached by the adhesive to the electrode support surface of the rigid substrate 1 except the vent-end edge portion 4, so that the thickness of the rigid substrate 1 (with the cover film 22 attached) at the vent-end edge portion 4 is smaller than the thickness of the remainder of the rigid substrate 1 (with the cover film 22 attached) other than the vent-end edge portion 4.

As shown in FIG. 6A, the rigid substrate 1 with the cover film 22 is disposed between the upper mold 2 and the lower mold 3 of the encapsulation mold, and the void 22a corresponding to the portion where the cover film 22 is not attached is formed between the electrode support surface of the rigid substrate 1 and the lower mold 3 at the vent-end edge portion 4 of the rigid substrate 1.

Next, as shown in FIG. 6B, the resin is injected into the mold cavity 2a of the upper mold 2 of the encapsulation mold from the gate end (on the right-hand side of the Figure). The resin-encapsulation portion 11 (indicated by the shaded lines in FIG. 6B) which encapsulates the semiconductor elements supported by the chip support surface of the rigid substrate 1 is formed with the injected resin 11.

According to the present embodiment, the void 22a is formed between the vent-end edge portion 4 of the back surface of the rigid substrate 1 and the lower mold 3 by sticking the cover film 22 to the back surface of the rigid substrate 1 except the vent-end edge portion 4, and making the total thickness of the rigid substrate 1 and the cover film 22 at the vent-end edge portion 4 smaller than at the other portions.

Accordingly, the clamping pressure exerted by the upper mold 2 and the lower mold 3 on the vent-end edge portion 4 of the rigid substrate 1 is reduced, and the stress, causing the curvature or bending of the rigid substrate 1 and acting in the direction toward the upper mold at the time of the resin injection, can be released to the vent end of the encapsulation mold, and the deformation of the wires as in the conventional manufacturing method can be prevented. Moreover, the residual stress due to the curvature or bending of the semiconductor package after the resin encapsulation is performed can also be reduced, and the deformation and damage of the internal semiconductor elements (chips) can be prevented.

Figure 7A:
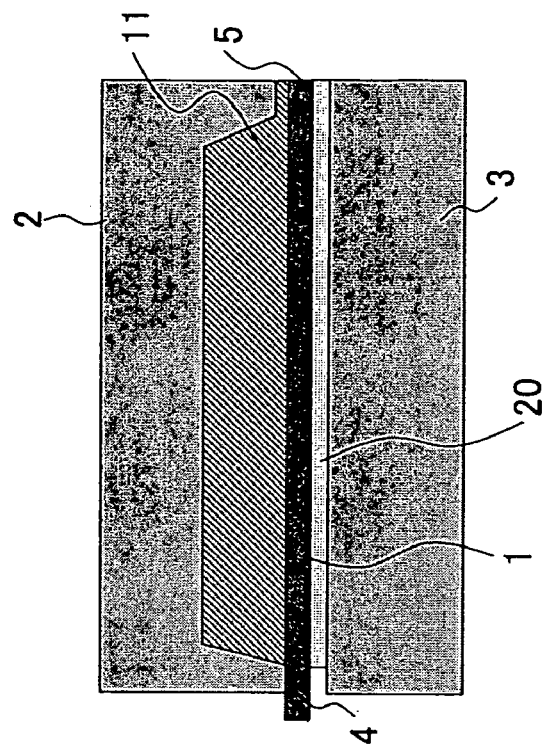
FIG. 7A and FIG. 7B are diagrams for explaining a molding process in another embodiment of the manufacturing method of the semiconductor device of the invention.
Figure 7B:
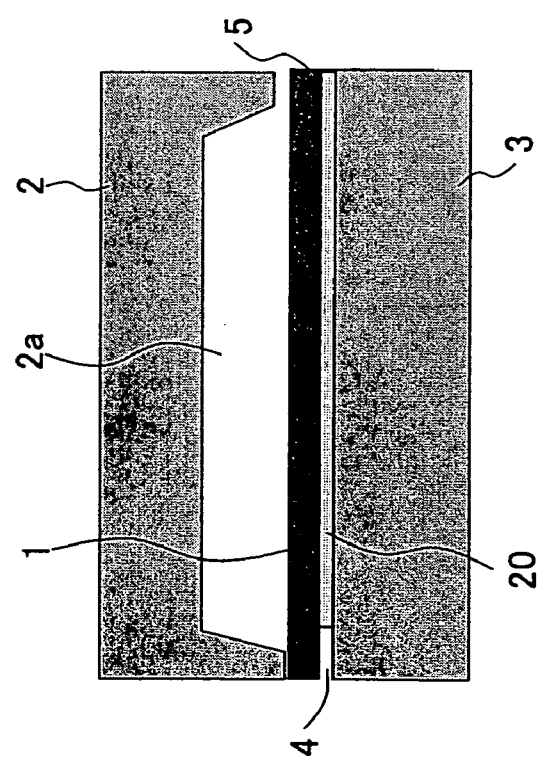

FIG. 7A and FIG. 7B are diagrams for explaining the molding process of the semiconductor device in another embodiment of the manufacturing method of the invention.

In the present embodiment, as shown in FIG. 7A, a release film 20 is attached by the adhesive to the lower mold 3 of the encapsulation mold except the vent-end portion of the lower mold 3, so that the void between the vent-end edge portion 4 of the electrode support surface of the rigid substrate 1 and the lower mold 3 is formed.

The rigid substrate 1 is disposed between the upper mold 2 and the lower mold 3 of the encapsulation mold, and the void corresponding to the portion where the release film 20 is not attached to the lower mold 3 is formed between the back surface of the rigid substrate 1 and the lower mold 3.

Next, as shown in FIG. 7B, the resin is injected into the mold cavity 2a of the upper mold 2 of the encapsulation mold from the gate end (on the right-hand side of the Figure). The resin-encapsulation portion 11 (indicated by the shaded lines in FIG. 7B) which encapsulates the semiconductor elements supported by the chip support surface of the rigid substrate 1 is formed with the injected resin.

According to the present embodiment, the void is formed between the vent-end edge portion 4 of the back surface of the rigid substrate 1 and the lower mold 3 by attaching the release film 20 to the lower mold 3 except the vent-end portion thereof, and making the total thickness of the rigid substrate 1 and the release film 20 at the vent-end edge portion 4 smaller than at the other portions.

Accordingly, the clamping pressure exerted by the upper mold 2 and the lower mold 3 on the vent-end edge portion 4 of the rigid substrate 1 is reduced, and the stress, causing the curvature or bending of the rigid substrate 1 and acting in the direction toward the upper mold at the time of the resin injection, can be released to the vent end of the encapsulation mold. The deformation of the wires as in the conventional manufacturing method can be prevented. Moreover, the residual stress due to the curvature or bending of the semiconductor package after the resin encapsulation is performed can also be reduced, and the deformation and damage of the internal semiconductor elements (chips) can be prevented.

Figure 8:
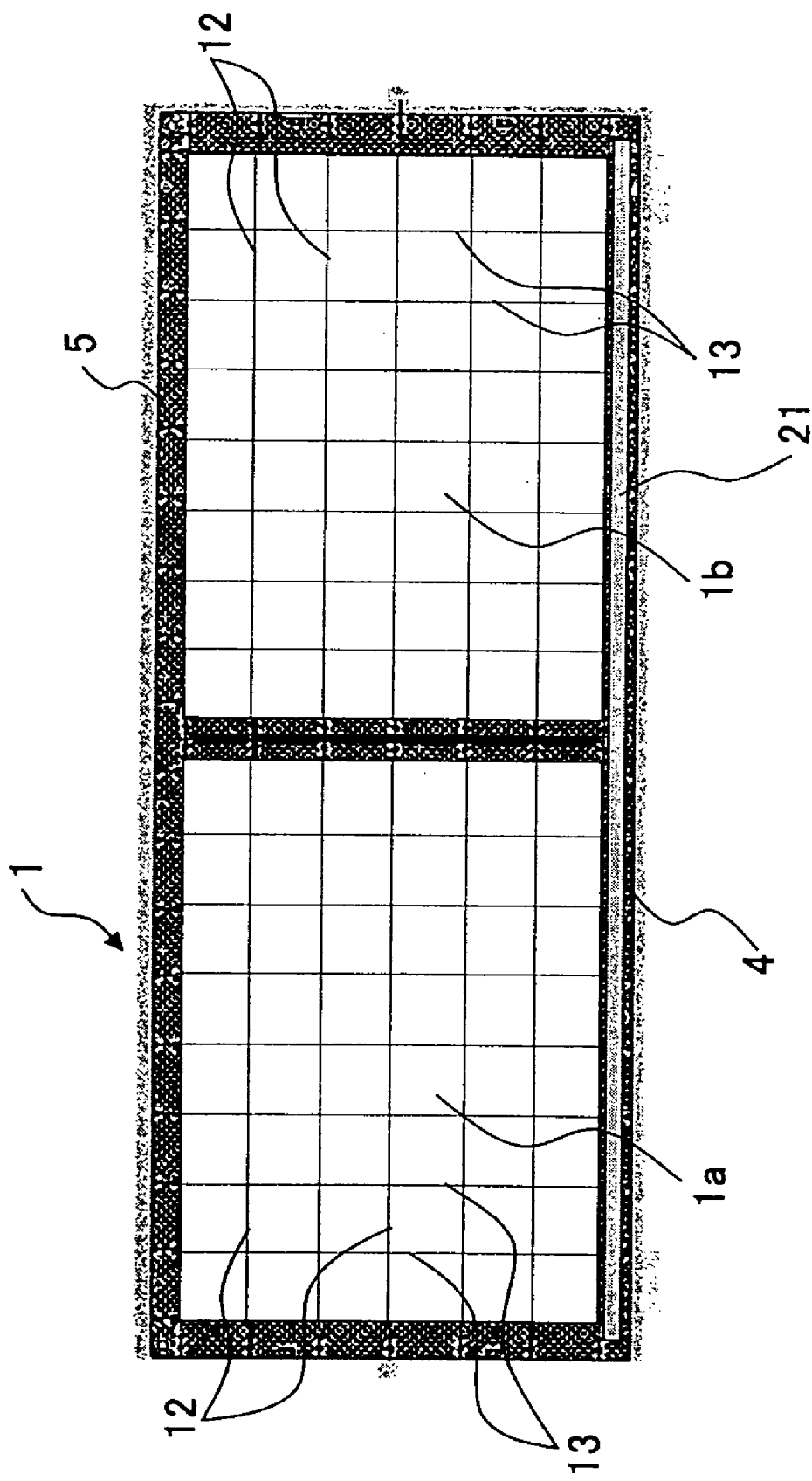
FIG. 8 is a diagram showing another embodiment of the rigid substrate according to the invention.

FIG. 8 shows another embodiment of the rigid substrate according to the invention.

As shown in FIG. 8, the rigid substrate 1 is provided with a slit 21 which is formed near the vent-end edge portion 4 which is the lower edge of the rectangular-shape rigid substrate 1. The slit 21 is provided so that it is open to the resin-encapsulation portion which will be formed within the mold cavity of the encapsulation mold when the rigid substrate 1 is disposed in the encapsulation mold.

In the present embodiment, the slit 21 of the rigid substrate 1 serves to reduce the injection pressure of the resin which may cause the curvature or bending of the rigid substrate 1 to be produced in the direction toward the upper mold at the time of the resin injection. Therefore, the slit 21 functions to reduce the deformation of the rigid substrate 1 after the resin encapsulation and the deformation of the semiconductor elements at the time of the resin encapsulation.

Figure 9A:
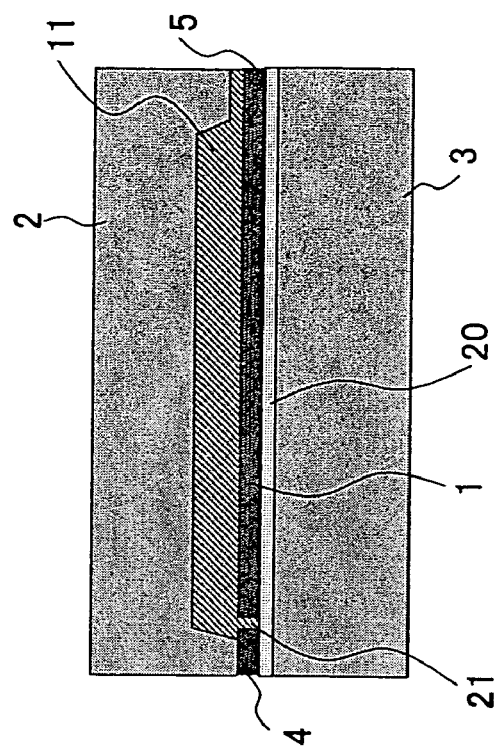
FIG. 9A and FIG. 9B are diagrams for explaining a molding process of the semiconductor device using the rigid substrate of FIG. 8 in another embodiment of the manufacturing method of the invention.
Figure 9B:
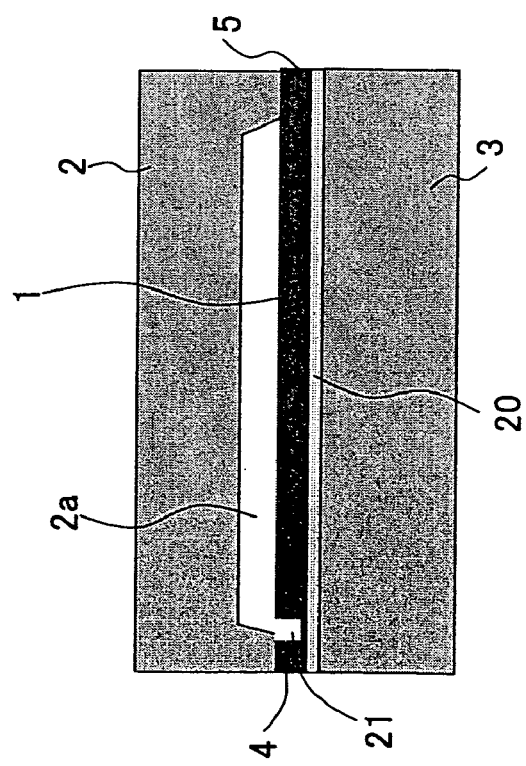

FIG. 9A and FIG. 9B are diagrams for explaining the molding process of the semiconductor device using the rigid substrate of FIG. 8 in another embodiment of the manufacturing method of the invention.

FIG. 9A shows a state of the semiconductor device before the resin injection is performed in the unified molding process, and FIG. 9B shows a state of the semiconductor device after the resin injection is performed.

The encapsulation mold used for the semiconductor device of FIG. 9A is provided with the upper mold 2 and the lower mold 3, and the mold cavity 2a is formed in the upper mold 2.

First, as shown in FIG. 9A, the rigid substrate 1 is disposed between the upper mold 2 and the lower mold 3. In this state, the slit 21 on the chip support surface of the rigid substrate 1 is open to the mold cavity 2a of the upper mold 2.

The release film 20 is attached by the adhesive to the lower mold 3 so that the electrode support surface (the back surface) of the rigid substrate 1 is completely covered by the release film 20 on the lower mold 3.

Next, as shown in FIG. 9B, the resin is injected from the gate end (on the right-hand side of the Figure) into the mold cavity 2a of the upper mold 2. The resin-encapsulation portion 11 (indicated by the shaded lines in FIG. 9B) which collectively encapsulates two or more semiconductor elements supported by the chip support surface of the rigid substrate 1 is formed with the injected resin.

According to the unified molding process of the semiconductor device using the rigid substrate 1 of FIG. 8, the slit 21 is formed near the vent-end edge portion 4 of the rigid substrate 1, and the deformation of the semiconductor device can be prevented by reducing the injection pressure of the resin which may cause the curvature or bending of the rigid substrate to be produced in the direction toward the upper mold 2 at the time of the resin injection. Moreover, the residual stress due to the curvature or bending of the rigid substrate after the resin encapsulation is performed can also be reduced, and the deformation and damage of the internal semiconductor elements can be prevented.

Furthermore, according to the present embodiment, it is possible to prevent, with the release film 20 attached to the lower mold 3 completely, the leaking of the injected resin from the slit 21 and the entering of the injected resin to the back surface of the rigid substrate 1.

FIG. 10A through FIG. 10E are diagrams for explaining the molding process of the semiconductor device in another embodiment of the manufacturing method of the invention.

FIG. 10C shows a state of the semiconductor device before the resin injection is performed in the unified molding process, FIG. 10D shows a state of the semiconductor device at the time of performing the resin injection, and FIG. 10E shows a state of the semiconductor device after the resin injection is performed.

FIG. 10A is an enlarged view of the vent-end edge portion 4 of the rigid substrate 1 before the resin injection indicated by the character A in FIG. 10C or the vent-end edge portion 4 at the time of the resin injection indicated by the character B in FIG. 10D. FIG. 10B is an enlarged view of the vent-end edge portion 4 of the rigid substrate 1 after the resin injection indicated by the character C in FIG. 10E.

The molding process of FIG. 10A through FIG. 10E is performed using the transfer molding equipment (not shown). The transfer molding equipment is provided with the upper mold 2 and the lower mold 3 of the encapsulation mold, and the mold cavity 2a is formed in the upper mold 2. Moreover, the transfer molding equipment is provided with the control unit which is capable of adjusting the clamping pressure to clamp the rigid substrate 1 between the upper mold 2 and the lower mold 3.

In the present embodiment, the rigid substrate 1 includes the gate-end edge portion 5, the vent-end edge portions 4, the chip support surface that supports a plurality of semiconductor elements (chips), and the electrode support surface which is opposite to the chip support surface.

First, as shown in FIG. 10C, the rigid substrate 1 is disposed between the upper mold 2 and the lower mold 3. The die-bonding process and the wire-bonding process are already completed with the rigid substrate 1 in this state. The plurality of semiconductor elements (chips) are arranged on the chip support surface of the rigid substrate 1, and they are mounted in the chip array regions. The surface electrodes (pads) of each semiconductor element and the connection terminals (electrodes) formed on the rigid substrate 1 are interconnected by the wires (not shown).

Next, with the transfer molding equipment, the temporary clamping of the rigid substrate 1 with the upper mold 2 and the lower mold 3 is carried out by setting the clamping pressure to a first pressure that is small enough to allow separation of the upper mold 2 from the chip support surface of the rigid substrate 1 at the vent-end edge portion 4 at the time of the resin injection which is the subsequent process.

As shown in FIG. 10A, during the resin injection, the upper mold 2 and the rigid substrate 1 are in contact with each other or in a state in which the upper mold 2 is slightly separated from the rigid substrate 1 at the vent-end edge portion 4. This makes it possible to reduce the injection pressure of the resin which may cause the curvature or bending of the rigid substrate 1 to be produced in the direction toward the upper mold 2. The stress acting in the direction toward the upper mold 2 can be released to the vent-end edge portion 4.

Next, as shown in FIG. 10D, the resin 11 is injected into the mold cavity 2a of the upper mold 2 from the gate end.

Simultaneously with the end of the injection of the resin 11, as shown in FIG. 10B or FIG. 10E, with the transfer molding equipment, the clamping pressure is set to a second pressure that is larger than the first pressure and enough to inhibit separation of the upper mold 2 from the chip support surface of the rigid substrate 1 at the vent-end edge portion 4, and the final clamping of the rigid substrate 1 with the upper mold 2 and the lower mold 3 is carried out. The chip support surface of the rigid substrate 1 at the vent-end edge portion 4 is actually compressed by the upper mold 2.

Next, the resin-encapsulation portion 11, which collectively encapsulates the semiconductor elements supported by the chip support surface of the rigid substrate 1, is formed with the injected resin.

When compared with the molding process of the above-described embodiment, in the conventional molding process, after the final clamping of the rigid substrate with the encapsulation mold is carried out, the resin injection is performed. Hence, there is the problem that the deformation of the curvature or bending of the substrate and the deformation of the semiconductor elements and the wires thereof may easily arise.

According to the molding process of the above-described embodiment of FIG. 10A through FIG. 10E, the clamping pressure of the rigid substrate 1 is controlled selectively in accordance with the elapsed time between the start of the resin injection and the end of the resin injection.

The deformation of the semiconductor elements and the wires thereof can be prevented by carrying out the above-mentioned temporary clamping of the rigid substrate 1 in the encapsulation mold at the time of the resin injection as shown in FIG. 10A. The temporary clamping serves to release the injection pressure of the resin, causing the curvature or bending of the rigid substrate 1 and acting in the direction toward the upper mold 2 at the time of the resin injection, to the vent end of the encapsulation mold.

Moreover, the leakage of the resin from the vent-end edge portion 4 of the rigid substrate 1 can be prevented by performing the final clamp of the rigid substrate 1 simultaneously with the end of the resin injection as shown in FIG. 10B. Moreover, the residual stress due to the curvature or bending of the semiconductor package after the resin encapsulation is performed can also be reduced, and the deformation and damage of the internal semiconductor elements can be prevented.

The present invention is not limited to the above-described embodiments, and variations and modifications may be made without departing from the scope of the present invention.

What is claimed is:

1. A manufacturing method of a semiconductor device including a rigid substrate on which one or more semiconductor elements are supported, comprising the steps of:

providing an encapsulation mold having an upper mold and a lower mold for clamping the rigid substrate between the upper mold and the lower mold at a time of resin encapsulation, so that the lower mold has a void at a vent end portion of the lower mold corresponding to a vent-end edge portion of the substrate;

disposing the substrate in the encapsulation mold; and injecting resin into a cavity between the upper mold and the substrate to encapsulate the semiconductor elements with the resin;

wherein the vent-end portion of the lower mold is cut off to form the void beneath the substrate at a position corresponding to the vent-end edge portion of the substrate.

2. A manufacturing method of a semiconductor device, comprising the steps of:

providing a rigid substrate which supports one or more semiconductor elements on a front surface of the substrate and is clamped between an upper mold and a lower mold of an encapsulation mold at a time of resin encapsulation;

attaching a cover film to a back surface of the substrate so that the back surface of the substrate except a vent-end edge portion of the substrate corresponding to a vent end of the encapsulation mold is covered by the cover film so as to form a void at the vent-end edge portion;

disposing the substrate with the cover film in the encapsulation mold; and injecting resin into a cavity between the upper mold and the substrate to encapsulate the semiconductor elements with the resin.

3. A manufacturing method of a semiconductor device, comprising the steps of:

providing an encapsulation mold having an upper mold and a lower mold for clamping a rigid substrate, which supports one or more semiconductor elements on a surface of the substrate, between the upper mold and the lower mold at a time of resin encapsulation;

attaching a release film to a surface of the lower mold so that the surface of the lower mold except a portion confronting a vent-end edge portion of the substrate corresponding to a vent end of the encapsulation mold is covered by the release film so as to form a void at the vent-end edge portion;

disposing the substrate in the encapsulation mold; and injecting resin into a cavity between the upper mold and the substrate to encapsulate the semiconductor elements with the resin.

4. A manufacturing method of a semiconductor device, comprising the steps of:

providing a rigid substrate which supports one or more semiconductor elements on a front surface of the substrate and is clamped between an upper mold and a lower mold of an encapsulation mold at a time of resin encapsulation;

forming the substrate with a slit, the slit being formed in a vent-end edge portion of the substrate corresponding to a vent end of the encapsulation mold;

attaching a release film to the lower mold so that a back surface of the substrate, including a portion opposite to the slit formed in the vent-end edge portion of the substrate, is covered by the release film;

disposing the substrate with the slit formed therein in the encapsulation mold; and injecting resin into a cavity between the upper mold and the substrate to encapsulate the semiconductor elements with the resin.

5. A manufacturing method of a semiconductor device, comprising the steps of:

disposing a rigid substrate, which supports one or more semiconductor elements on a surface of the substrate, between an upper mold and a lower mold of an encapsulation mold;

clamping the substrate with the upper mold and the lower mold by setting a clamping pressure to a first pressure that is small enough to allow separation of the upper mold from the substrate surface at a vent-end edge portion of the substrate;

injecting resin into a cavity of the encapsulation mold;

setting, after an end of the resin injection, the clamping pressure to a second pressure that is larger than the first pressure and enough to compress the substrate surface by the upper mold at the vent-end edge portion; and encapsulating the semiconductor elements supported on the substrate surface with the injected resin.

* * * * *